United States Patent
Sakai et al.

(10) Patent No.: US 6,900,542 B2
(45) Date of Patent: May 31, 2005

(54) SEMICONDUCTOR DEVICE HAVING INCREASED ADHESION BETWEEN A BARRIER LAYER FOR PREVENTING COPPER DIFFUSION AND A CONDUCTIVE LAYER, AND METHOD OF MANUFACTURING THE SAME

(75) Inventors: Hisaya Sakai, Kawasaki (JP); Noriyoshi Shimizu, Kawasaki (JP); Nobuyuki Ohtsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/428,208

(22) Filed: May 2, 2003

(65) Prior Publication Data

US 2004/0000716 A1 Jan. 1, 2004

Related U.S. Application Data

(63) Continuation of application No. PCT/JP01/09588, filed on Nov. 1, 2001.

(30) Foreign Application Priority Data

Nov. 2, 2000 (JP) ........................................ 2000-335690

(51) Int. Cl.$^7$ .......................... H01L 23/48; H01L 23/52; H01L 29/40
(52) U.S. Cl. ........................................ 257/761; 257/762
(58) Field of Search ................................ 257/761, 762, 257/758

(56) References Cited

U.S. PATENT DOCUMENTS 4,910,169 A * 3/1990 Hoshino ...................... 438/660
5,856,236 A * 1/1999 Lai et al. ...................... 438/681
6,265,779 B1 * 7/2001 Grill et al. .................... 257/759

FOREIGN PATENT DOCUMENTS

| JP | 5-102152 | 4/1993 |
|---|---|---|
| JP | 9-330647 | 12/1997 |
| JP | 2000-182741 | 3/2000 |
| JP | 2000-183003 | 6/2000 |
| JP | 2001-15517 | 1/2001 |
| JP | 2001-230219 | * 8/2001 |
| JP | 2001-250829 | 9/2001 |
| JP | 2001-284358 | 10/2001 |

* cited by examiner

*Primary Examiner*—Phat X. Cao
(74) *Attorney, Agent, or Firm*—Arent Fox PLLC (57) ABSTRACT

A semiconductor device comprises of an insulating film (14) formed over a semiconductor substrate (1), a trench (14b) and a hole (14a) formed in the insulating film (14), a first underlying layer (16) formed in at least one of the trench (14b) and the hole (14a) and made of conductive material to prevent diffusion of copper, a main conductive layer (19) formed in at least one of the trench (14b) and the hole (14a) on the first underlying layer (19) and made of copper or copper alloy, and a second underlying layer (17) formed between the main conductive layer (19) and the first underlying layer (16) and having a metal element that is solid-solved in the main conductive layer at an interface between the second underlying layer (17) and the main conductive layer (19), and formed on the first underlying layer (16) by a CVD method.

9 Claims, 10 Drawing Sheets

FIG. 1(a)

4, 6, 14 · · · interlayer insulating film

SEMICONDUCTOR DEVICE HAVING INCREASED ADHESION BETWEEN A BARRIER LAYER FOR PREVENTING COPPER DIFFUSION AND A CONDUCTIVE LAYER, AND METHOD OF MANUFACTURING THE SAME

This nonprovisional application is a continuation of International Application No. PCT/JP01/09588, filed Nov. 1, 2001. The disclosure of the prior application is hereby incorporated herein in its entirety by reference.

TECHNICAL FIELD

The present invention relates to a semiconductor device and a method of manufacturing the same and, more particularly, a semiconductor device having a multi-layered structure wiring containing a copper layer and a method of manufacturing the same.

BACKGROUND ART

Individual semiconductor devices are miniaturized more and more with the progress of the working technology of the semiconductor integrated circuit (LSI). Also, the higher density, increase in the layer number, and reduction in the layer thickness of the wiring in LSI are accelerated, and thus the stress applied to the wiring and the density of the current that flows through the wiring are steadily increased respectively. Therefore, if the high-density current is supplied to the wiring, the breaking phenomenon of the wiring, which is called the electromigration (EM), for example, is ready to occur. It is considered that, since the metal atoms are moved/diffused due to the collision of the high-density electron current, a driving force of the electromigration is caused. Because the deterioration phenomenon caused due to the electromigration becomes intensified more and more with the miniaturization of the device, the wiring material and the wiring structure with the higher reliability, through which the current with higher density can be supplied, must be developed In the semiconductor device, the copper wiring is employed as the wiring in which the electromigration is difficult to occur rather than the aluminum wiring.

As the method of forming the copper wiring, the damascene method having the step of burying the copper in the trench formed in the interlayer insulating film is put in practical use. Also, the dual-damascene method for forming the via hole under the trench to form the via and the wiring simultaneously is known. It is the mainstream that, prior to bury the copper in such trench and such via hole, the barrier layer and the copper seed layer are formed as the underlying layer of the copper by the sputter method. The barrier layer is used to prevent the diffusion of copper and serves as a part of the wiring or the plug. Also, the copper seed layer is formed to promote the growth of the copper film.

Meanwhile, in the generation of the 0.1 μm rule device, it is considered that a diameter of the via hole formed under the wiring is reduced up to about 0.15 μm and also it is supposed that the aspect ratio exceeds 5.

In the case that the fine via and wiring are formed of copper, if it is tried to form the barrier layer and the copper seed layer in the via hole and the trench by the sputter, following problems are caused.

First, good coverage cannot be obtained by the sputter method. Therefore, if the barrier layer is to be formed in the fine via hole, for example, the barrier layer having a film thickness that is considerably thicker than that required of the side wall of the via hole must be formed on the insulating film around the via hole. As a result, if the wiring is formed by the dual-damascene method, a rate of the barrier layer in a sectional area of the trench becomes large. Since the material used as the barrier layer has a high resistance normally, the resistance of the overall wiring is increased if an occupied rate of the barrier layer in the wiring is increased, and thus the merit that the copper wiring having the low resistance is used is eliminated. Also, if the barrier layer formed on the bottom of the via hole becomes thick, the contact resistance is increased in the via hole.

Second, the sputter method has its limit on the coverage. Therefore, overhang such that the copper seed layer is formed to block slightly the opening of the fine via hole, lack of the coverage caused on the side wall of the via hole, and aggregation of the copper seed layer are generated. Thus, it is difficult to bury perfectly the copper in the via hole by the later electrolytic plating.

Accordingly, in order to respond to the further miniaturization in the future, the thin barrier layer and the copper seed layer must be formed by the CVD method that has the good coverage.

However, if the barrier layer made of titanium nitride (TiN) is formed by the CVD method employing tetrakis (diethylamino)titanium (Ti{N(C$_2$H$_5$)}$_4$: TDEAT), it is difficult to reduce the resistance lower than 500 μΩcm.

Also, if the barrier layer is formed by using TDEAT only, the coverage of the via hole is good, but the porous barrier layer containing the carbon impurity is formed. In contrast, if NH$_3$ is added by a minute amount in forming such barrier layer, the film quality is improved and also the low-resistance film containing the small carbon impurity can be formed. But the good coverage cannot be obtained.

In the existing condition, the film resistance of the barrier layer formed under the condition that the coverage of more than 35% can be obtained at the via bottom is about 500 μΩcm. In order to reduce sufficiently the resistance of the via chain or the overall wiring, the barrier film having the bottom coverage of more than 50% and less than 300 μΩcm is required.

Also, if the TiN barrier layer and the copper seed layer are formed by the present CVD technology, the adhesion between these layers becomes insufficient. Therefore, these layers cannot stand the thermal stress applied in forming the multi-layered wiring structure, or the mechanical stress applied by chemically mechanically polishing (CMP) the unnecessary copper seed layer and barrier layer, etc., and thus the copper seed layer peels off easily from the barrier layer. As a result, that is not put to practical use.

DISCLOSURE OF INVENTION

It is an object of the present invention to provide a semiconductor device containing a wiring whose wiring resistance or contact resistance containing a barrier layer is lower than the prior art and which has the barrier layer and a copper layer or a copper-containing material layer, both having good adhesion mutually, and a method of manufacturing the same.

The above subject can be overcome by providing a semiconductor device which comprises an insulating film formed over a semiconductor substrate; a trench and a hole formed in the insulating film; a first underlying layer formed in at least one of the trench and the hole and made of conductive material to prevent diffusion of copper; a main conductive layer formed in at least one of the trench and the hole on the first underlying layer and made of copper or copper alloy; and a second underlying layer formed between the main conductive layer and the first underlying layer and having a metal element that is solid-solved in the main conductive layer at an interface between the second underlying layer and the main conductive layer, and formed on the first underlying layer by a CVD method.

Also, the above subject can be overcome by providing a semiconductor device manufacturing method which comprises the steps of forming an insulating film over a semiconductor substrate; forming a trench and a hole in the insulating film; forming a first underlying layer, which is made of conductive material to prevent diffusion of copper, in the trench or the hole and on the insulating film by a CVD method; forming a second underlying layer, which has a metal element that is solid-solved in a copper layer, on the first underlying layer by the CVD method; forming a main conductive layer, which is made of copper or copper alloy, on the second underlying layer; and removing the first underlying layer, the second underlying layer, and the main conductive layer from an upper surface of the insulating film to leave in the trench and the hole.

According to the present invention, there is provided such a structure that the first underlying layer (barrier layer) made of the copper diffusion preventing material such as titanium nitride, tantalum nitride or tungsten nitride or material that contains them as major components, etc., the second underlying layer having the metal whose specific resistance, when such metal is alloyed with the copper, is higher than the specific resistance of the copper by 0 to 5% and formed by the CVD method, and the upper portion layer made of the copper or the material containing the copper as the major component are formed sequentially in the trench or the hole that is formed in the insulating film over the semiconductor substrate.

According to this, a total specific resistance of the first and second underlying layers can be lowered rather than the case that the upper portion layer is formed directly on the first underlying layer. In addition, the adhesion between the first underlying layer and the copper layer can be strengthened rather than the prior art. As a result, the good wiring or via that has no peeling-off and has the low resistance can be constructed in the insulating film by the first underlying layer and the upper portion layer.

In this case, the copper layer signifies the layer that is made of any one of copper and copper alloy. Also, the second underlying layer is made of zirconium, cadmium, zinc or silver, or alloy of any one of those, or the material containing zirconium and nitrogen. The material containing zirconium and nitrogen is a concept that contains zirconium nitride.

BEST MODE FOR CARRYING OUT THE INVENTION

Embodiments of the present invention will be explained with reference to the drawings hereinafter.

(First Embodiment)

Figure 1A:
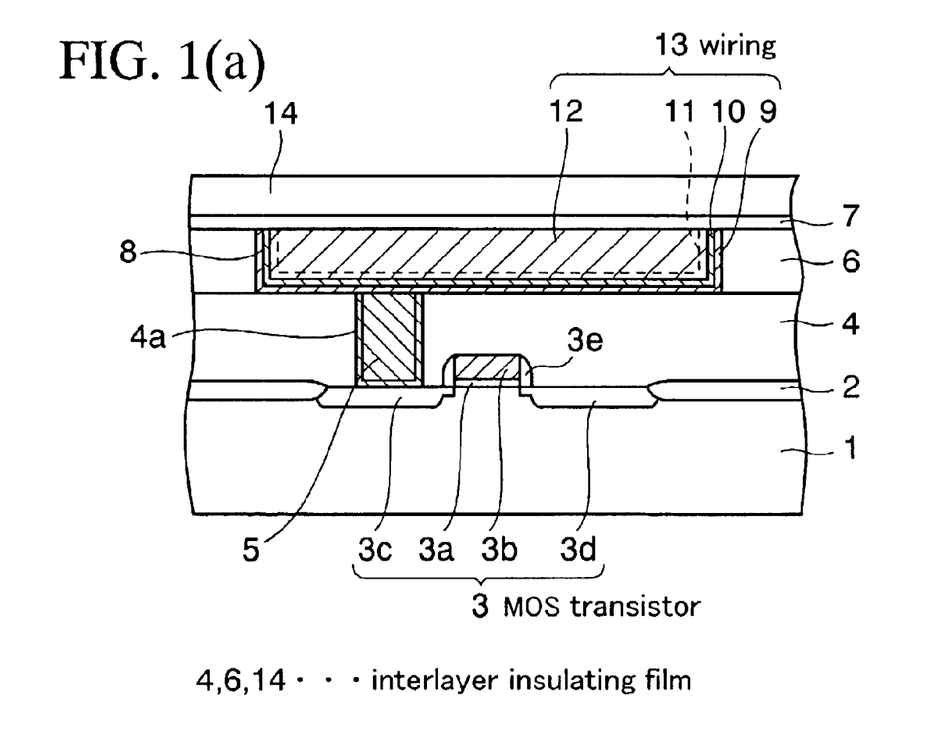
FIG. 1(a) is a sectional view showing a semiconductor device according to a first embodiment of the present invention.

FIG. 1(a) is a sectional view of a semiconductor device showing a first embodiment of the present invention.

In FIG. 1(a), an element isolation insulating layer 2 is formed on a p-type silicon (semiconductor) substrate 1 to surround an active element region. A MOS transistor 3 is formed in the active element region. The MOS transistor 3 consists of a gate electrode 3b that is formed on the silicon substrate 1 via a gate insulating film 3a, and first and second n-type impurity diffusion layers 3c, 3d that are formed in the semiconductor substrate 1 on both sides of the gate electrode 3b and have the LDD structure.

In this case, in FIG. 1, a symbol 3e denotes an insulating sidewall formed on a side surface of the gate electrode 3b.

A first interlayer insulating film 4 that covers the MOS transistor 3 and is made of $SiO_2$ is formed on the silicon substrate 1. A contact hole 4a is formed in the first interlayer insulating film 4 on the first n-type impurity diffusion layer 3c. A contact plug 5 having a double-layered structure consisting of a titanium nitride layer and a tungsten layer is formed in the contact hole 4a.

A second interlayer insulating film 6 made of SiO$_2$ is formed on the first interlayer insulating film 4. A trench 8 that passes over the contact plug 5 is formed in the second interlayer insulating film 6 by the photolithography method. The trench 8 has a wiring shape whose width is 150 to 300 nm and whose depth is 500 nm, for example.

A first underlying layer 9 made of titanium nitride (TiN) and a second underlying layer 10 made of zirconium nitride (ZrN) are formed sequentially on an inner peripheral surface and a bottom surface of the trench 8. The first underlying layer 9 functions as the barrier layer to prevent the diffusion of copper described later.

The titanium nitride is grown by the CVD method employing tetrakis(diethylamino)titanium(IV) (Ti{N(C$_2$H$_5$)}$_4$: TDEAT) to have a thickness of 10 nm or less under the conditions that a film forming pressure is 50 to 100 Pa and a growth temperature is 350 to 450° C.

Also, the zirconium nitride is grown by the CVD method employing tetrakis(diethylamino)zirconium(IV) (Zr{N(C$_2$H$_5$)$_2$}$_4$: TDEAZ) to have a thickness of 5 nm or less under the conditions that the film forming pressure is 50 to 100 Pa and the growth temperature is 350 to 450° C. A ratio of the number of atoms of the zirconium in the second underlying layer 10 is in excess of 30 atoms %.

The titanium nitride constituting the first underlying layer 9 is formed like a micro crystallite or an amorphous. Also, the zirconium nitride (ZrN) constituting the second underlying layer 10 has an average particle diameter of 10 nm or less and is formed like a micro crystallite or an amorphous.

In this case, in some cases the carbon is contained in the titanium nitride layer constituting the first underlying layer 9. Also, in some cases the carbon is contained in the zirconium nitride layer constituting the second underlying layer 10.

A copper seed layer 11 of 50 nm thickness, for example, is formed on the second underlying layer 10. Then, a copper layer 12 is formed on the copper seed layer 11 to have a thickness that can bury completely the trench 8. The copper seed layer 11 is formed by the CVD method employing trimethylvinylsilylhexafluoroacetylacetonate copper I (Cu(hfac)tmvs), trimethylvinylsilane (tmvs), and hexafluoroacetylacetone dihydrate (Hhfac 2H$_2$O) as the source gas, for example, under the conditions that is 0.1 to 0.5 kPa and the film forming temperature is 150 to 250° C.

Also, the copper layer 12 is formed by the plating method. In this case, sometimes the copper layer 12 is made of copper alloy that contains the copper as a major component.

The copper layer 12, the copper seed layer 11, and the first and second underlying layers 9, 10 being formed in such trench 8 are used as a wiring 13, and the first and second underlying layers 9, 10 constitute a lower layer of the wiring. Also, the copper seed layer 11 and the copper layer 12 constitute a main conductive layer of the wiring 13. In this case, the copper layer 12, the copper seed layer 11, and the first and second underlying layers 9, 10 being formed on an upper surface of the second interlayer insulating film 6 are removed by the CMP method respectively.

Meanwhile, in order not to expose the first underlying layer 9 to the atmosphere, it is preferable that growth of the second underlying layer 10 and growth of the first underlying layer 9 should be executed at the same place until the growth of at least the second underlying layer 10 is completed.

Figure 2:
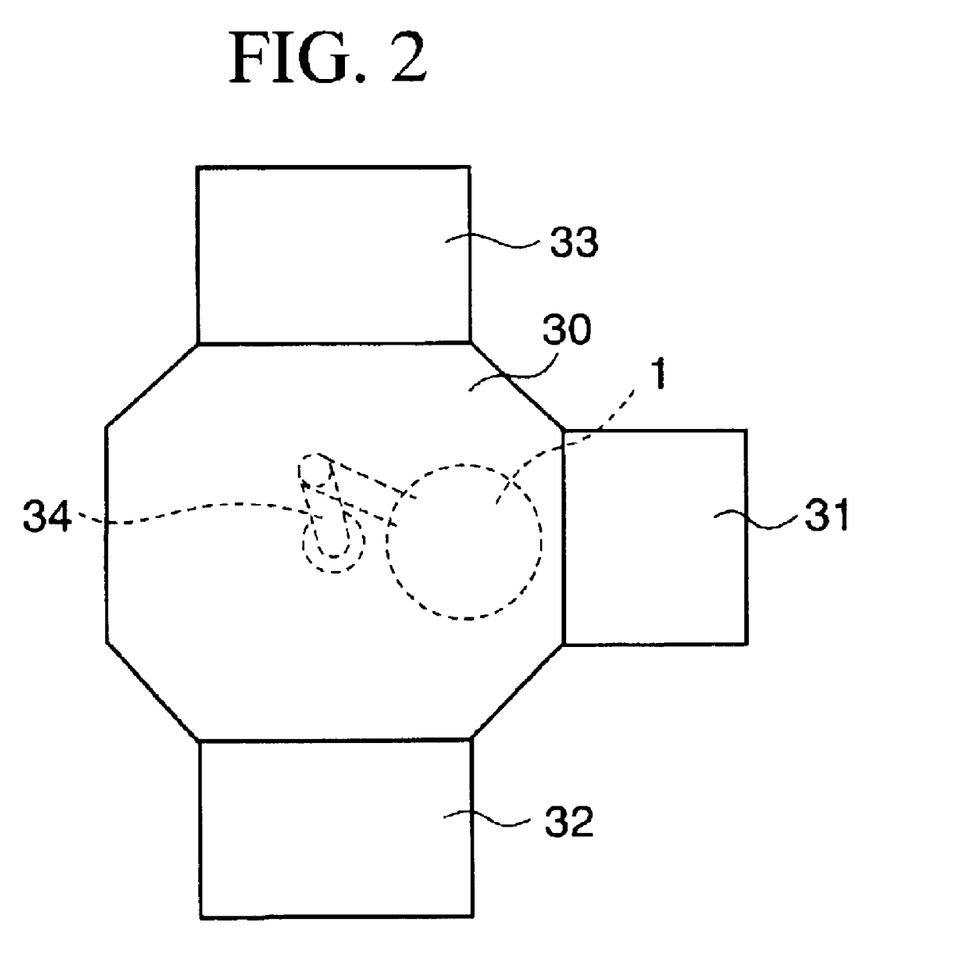
FIG. 2 is a view of an arrangement of the CVD equipment used to form an underlying layer and a copper seed layer of the semiconductor device according to the first embodiment of the present invention.

For example, as shown in FIG. 2, the equipment having the configuration in which two CVD chambers 31, 32 are connected to a transfer chamber 30 whose pressure is lowered is employed. Then, the silicon substrate 1 is transferred into the first CVD chamber 31 via a load lock chamber 33 and the transfer chamber 30, and then the first and second underlying layers 9, 10 are formed in the trench 8 and on the second interlayer insulating film 6 in the first CVD chamber 31. Then, the silicon substrate 1 is transferred from the first CVD chamber 31 to the second CVD chamber 32 via the transfer chamber 30, and then the copper seed layer 11 is grown in the second CVD chamber 32. Then, the silicon substrate 1 is taken out to the outside via the transfer chamber 30 and the load lock chamber 33. The transfer of the semiconductor substrate (wafer) 1 is executed by a robot arm 35.

A pressure in the transfer chamber 30 is lowered, but such pressure is higher than pressures in the first and second CVD chambers 31, 32. Therefore, if the first and second underlying layers 9, 10 are grown in the first CVD chamber 31, penetration of the impurity between these underlying layers 9, 10 can be prevented, and thus reduction in the adhesion between the first and second underlying layers 9, 10 can be prevented and also increase in the resistance of the overall underlying layers can be prevented.

In order to prevent the diffusion of copper, such wiring 13 is covered with a silicon nitride film 7, and then the silicon nitride film 7 is covered with a third interlayer insulating film 14.

Figure 1B:
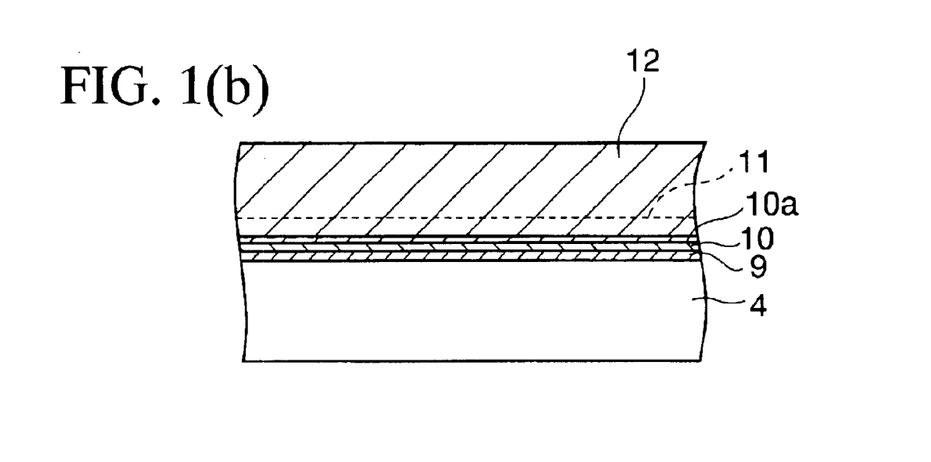
FIG. 1(b) is a view showing a structure of a copper wiring of the semiconductor device according to the first embodiment of the present invention.

The third interlayer insulating film 14 is formed at the growth temperature of the film forming temperature 300 to 450° C. by the CVD method using silane (SiH$_4$) and nitrogen monoxide (N$_2$O). As shown in FIG. 1(b), an intermediate layer 10a containing copper-zirconium alloy is formed between the copper layer 12 and the zirconium nitride layer constituting the second underlying layer 10 by the heating applied to form the third interlayer insulating film 14 or the heating applied to form the copper seed layer 11. Since the solid solubility of the zirconium to the copper is 0.02%, the specific resistance of the intermediate layer 10a is substantially identical to the copper and the intermediate layer 10a is very thin.

Figure 3A:
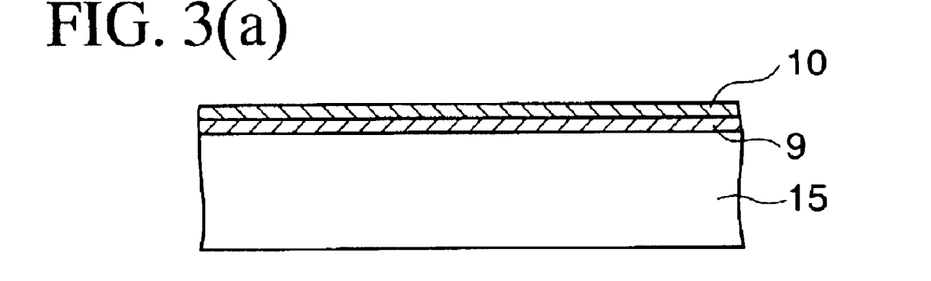
FIG. 3(a) is a sectional view showing the state that the underlying layer of the wiring shown in FIG. 1 is formed.
Figure 3B:
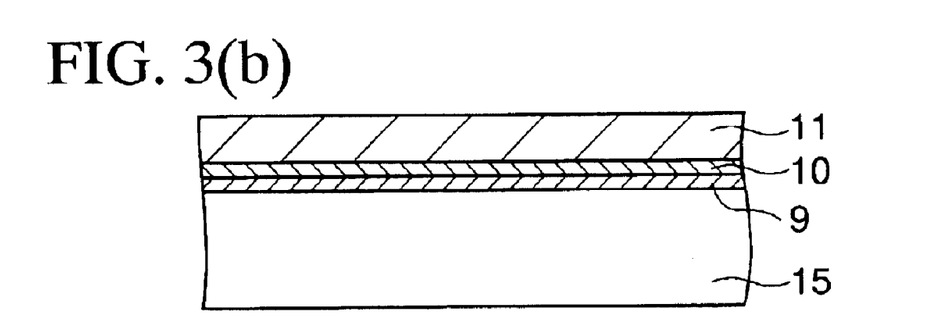
FIG. 3(b) is a sectional view showing the state that the copper seed layer is formed on the underlying layer.
Figure 3C:
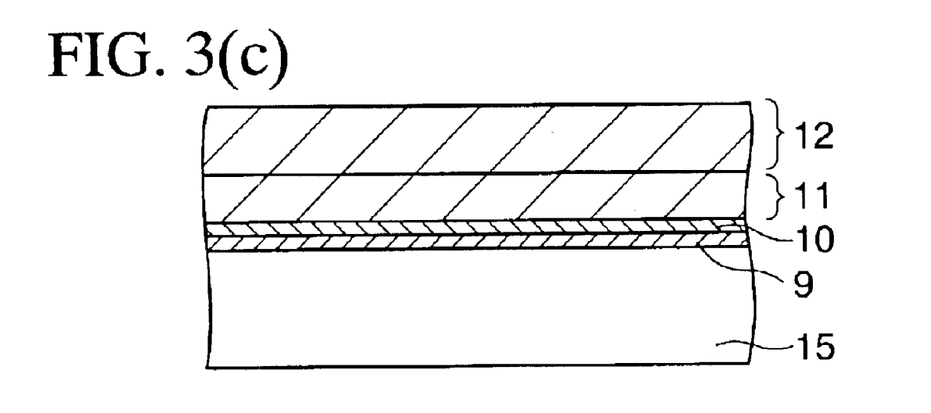
FIG. 3(c) is a sectional view showing the state that a copper layer is formed on the copper seed layer.

Meanwhile, in order to examine features of the above wiring 13, various samples shown in FIG. 3(a) to FIG. 3(c) were formed and then experiments were executed. These samples are the sample shown in FIG. 3(a) in which the first underlying layer 9 made of titanium nitride and having a film thickness of 10 nm and the second underlying layer 10 made of zirconium nitride and having a film thickness of 2.5 to 10.0 nm are grown sequentially on the SiO$_2$ film 15 by virtue of the CVD method respectively, the sample shown in FIG. 3(b) in which the copper seed layer 11 having a thickness of 50 nm is grown on the second underlying layer 10, and the sample shown in FIG. 3(c) in which the copper film 12 having a thickness of about 500 nm is grown on the copper seed layer 11 by the electrolytic plating method. In this case, the second underlying layer 10 may be formed like an island.

Figure 4:
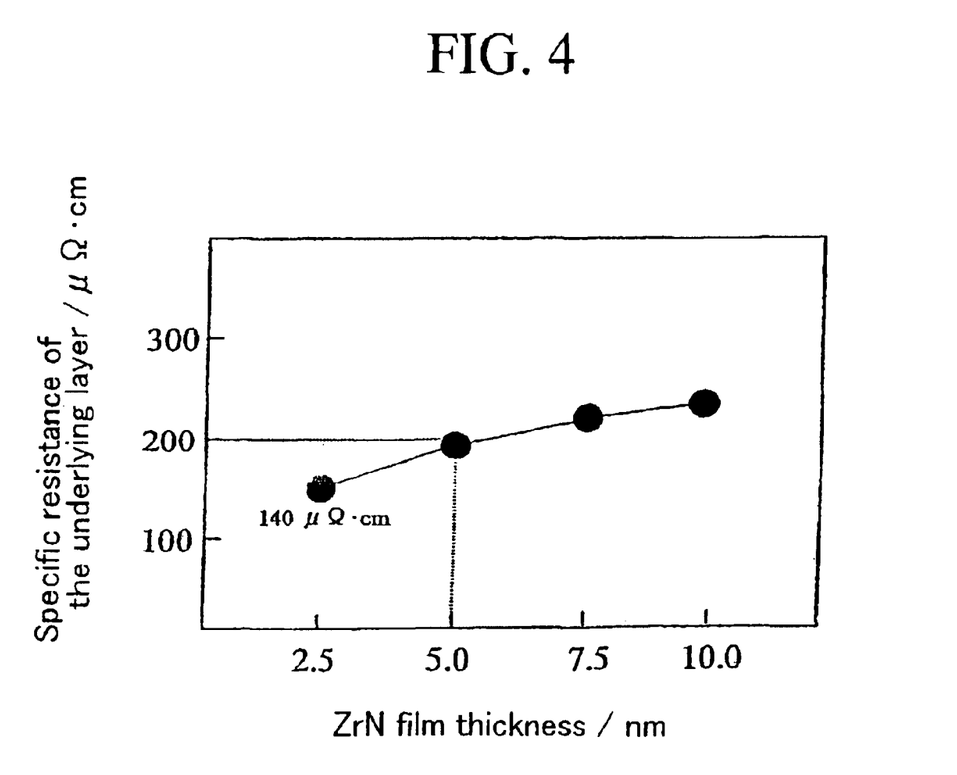
FIG. 4 is a view showing a relationship between a ZrN film thickness constituting the underlying layer of a copper-containing wiring, which is formed in the semiconductor device according to the first embodiment, and a specific resistance of the underlying layer.

When the resistance of the overall underlying layers was measured by changing the film thickness of the second underlying layer 10 within the range of 2.5 to 10.0 nm while keeping the film thickness of the first underlying layer 9 shown in FIG. 3(a) at 10 nm, results shown in FIG. 4 were derived.

According to FIG. 4, it is appreciated that, as the film thickness of the second underlying layer 10 in FIG. 3(a) to FIG. 3(c), the specific resistance of the overall underlying layers was reduced lower than 250 $\mu\Omega$cm. Since the underlying layers 9, 10 function as the wiring 13, their specific resistance must be reduced smaller than 200 µΩcm. For this reason, if the thickness of the titanium nitride film as the first underlying layer 9 is set to 10 nm, the thickness of the zirconium nitride film as the second underlying layer 10 must be set to 5 nm or less. That is, it is preferable that the film thickness of the zirconium nitride film should be set to smaller than 50% of the film thickness of the titanium nitride film.

In this case, the specific resistance of the titanium nitride constituting the first underlying layer 9 is 500 to 600 µΩcm, and the specific resistance of the zirconium nitride constituting the second underlying layer 10 is 13.6 µΩcm. Therefore, theoretically the specific resistance of the overall underlying layers is increased as the film thickness of the second underlying layer 10 is reduced. However, according to the experiments made by the inventors of this application, as shown in FIG. 4, the specific resistance of the overall underlying layers was lowered as the film thickness of the second underlying layer 10 was reduced.

Also, in FIG. 3(b), when the overall specific resistance of the copper seed layer 11 and the first and second underlying layers 9, 10 was measured by setting the film thickness of the second underlying layer 10 to 5 nm, that was 2.3 µΩcm.

In addition, in FIG. 3(c), when adhesion states of the copper film 12 and the copper seed layer 11 with respect to the first and second underlying layers 9, 10 were examined, it was found that an adhesion force between these layers is strong. In other words, the second underlying layer 10 made of ZrN functions as the adhesive layer to improve the adhesion between the first underlying layer 9 made of TiN and the overlying copper layers 11, 12.

In this case, the test indicating good or bad of the adhesion between the layers was decided depending on whether or not the copper film containing the copper seed layer is peeled off from the underlying layer when the adhesive tape that is posted on the copper film is peeled off forcedly. It was decided that the adhesion is good when such copper film is not peeled off from the underlying layer, while the adhesion is bad when such copper film is peeled off from the underlying layer.

Figure 5A:
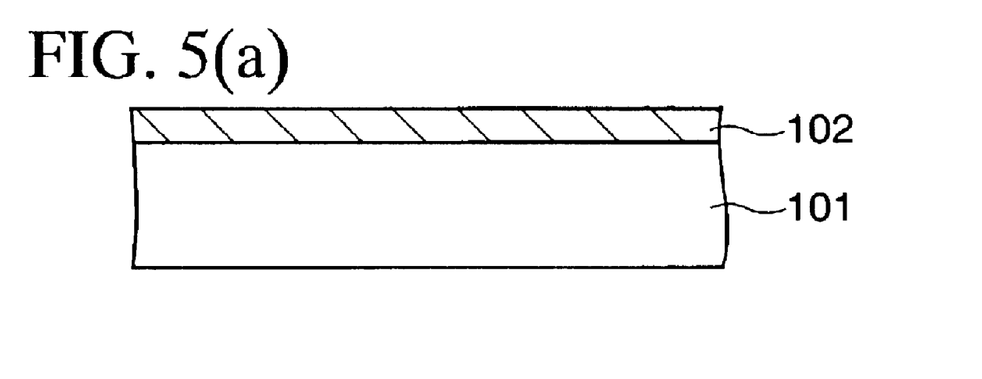
FIG. 5(a) is a sectional view showing the state that the underlying layer of the wiring having the structure in the prior art is formed.
Figure 5B:
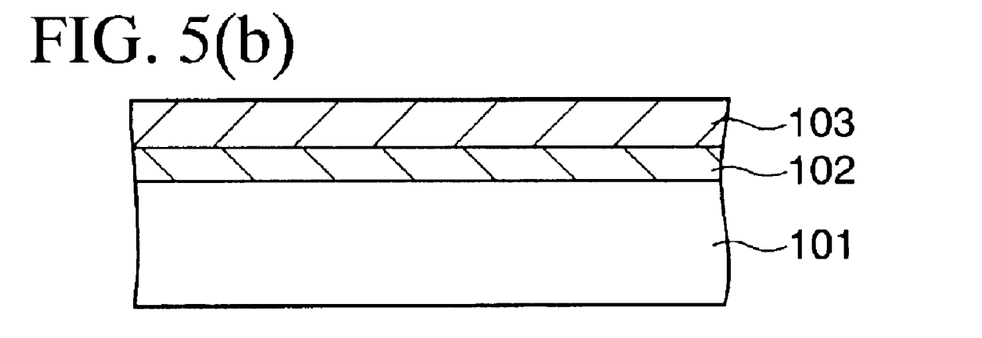
FIG. 5(b) is a sectional view showing the state that the copper seed layer is formed on the underlying layer of the wiring having the structure in the prior art.
Figure 5C:
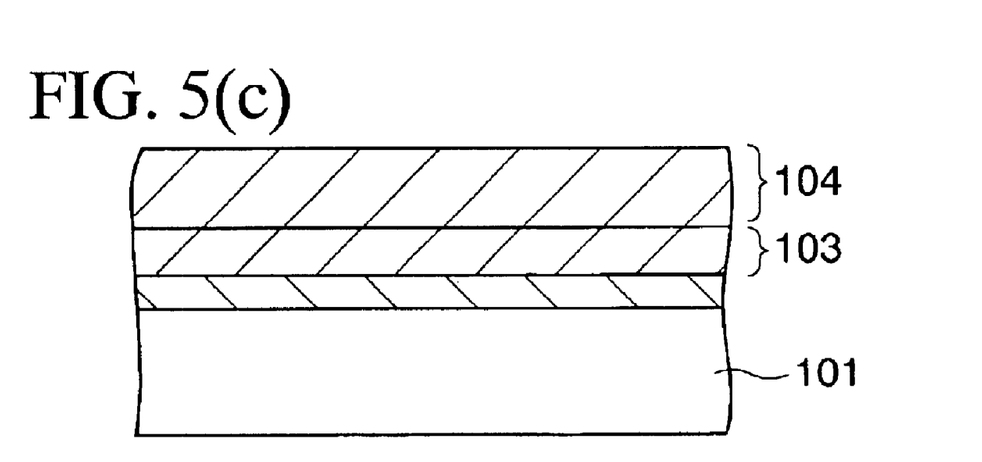
FIG. 5(c) is a sectional view showing the state that the copper layer is formed on the copper seed layer formed on the underlying layer of the wiring having the structure in the prior art.

In order to compare the wiring in the present embodiment with the wiring in the prior art, samples shown in FIG. 5(a) to FIG. 5(c) were formed as the copper wiring having the conventional structure. FIG. 5(a) shows the sample in which an underlying layer (barrier layer) 101 made of titanium nitride and having a film thickness of 15 nm is formed on an SiO₂ film 100, FIG. 5(b) shows the sample in which a copper seed layer 102 of 50 nm thickness is formed on the underlying layer 101, and FIG. 5(c) shows the sample in which a copper layer 103 of about 500 nm thickness is formed on the copper seed layer 102.

The specific resistance of the underlying layer 101 in FIG. 5(a) is about 600 µΩcm, and is 2.5 times or more rather than the specific resistances of the underlying layers 9, 10 having the structure shown in FIG. 3(a) in the present embodiment.

Also, when the overall specific resistance of the copper seed layer 102 and the underlying layer 101 shown in FIG. 5(b) was measured, that was 2.8 µΩcm. In addition, in FIG. 5(c), when the adhesion states of the copper layer 103 and the copper seed layer 102 with respect to the underlying layer 101 were examined, it was found that an adhesion force between these layers is weak. As a result, it was found that an interface between the copper seed layer 102 and the titanium nitride underlying layer 101 was brought into the state at which the specific resistance is increased and the adhesion between these layers is lowered.

(Second Embodiment)

Figure 6A:
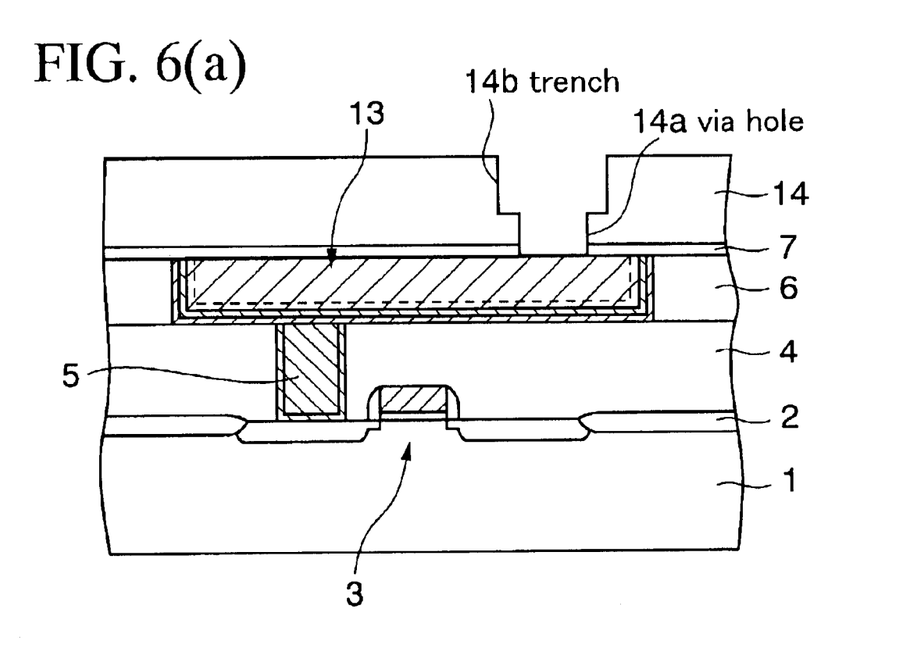
FIGS. 6(a),(b) are sectional views (#1) showing steps of forming a wiring and a via of a semiconductor device according to a second embodiment of the present invention.
Figure 6B:
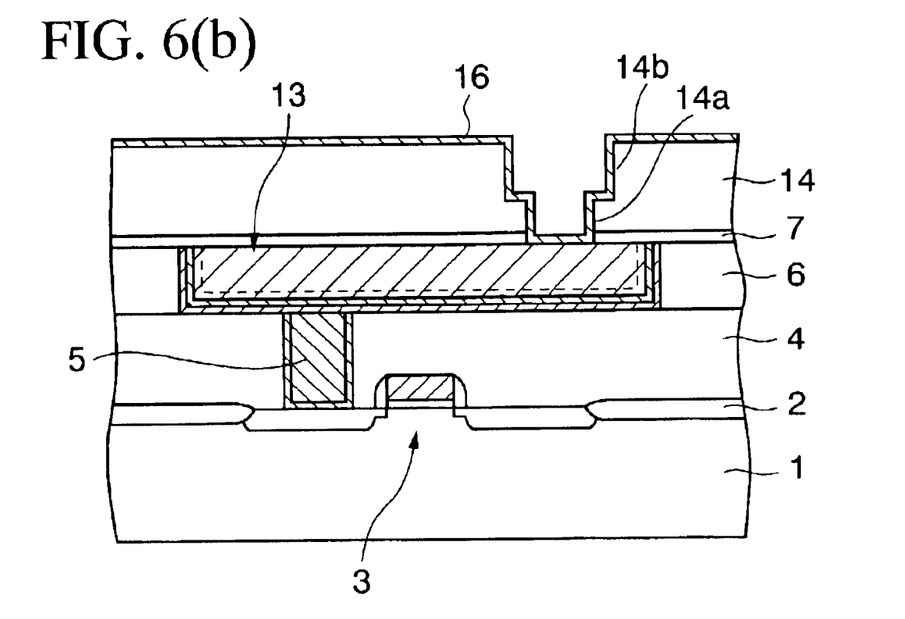
Figure 7A:
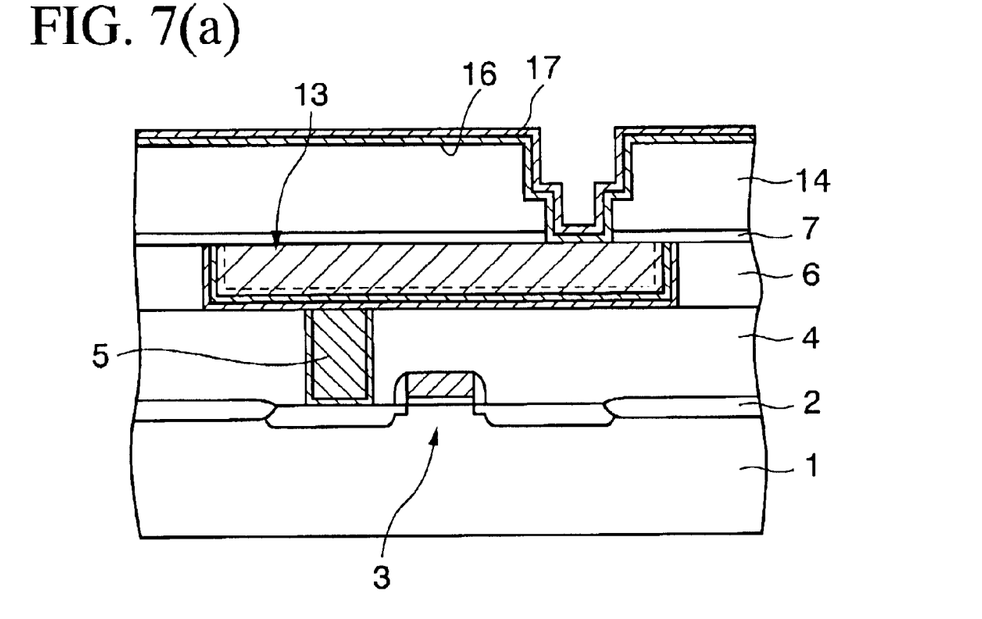
FIGS. 7(a),(b) are sectional views (#2) showing steps of forming the wiring and the via of the semiconductor device according to the second embodiment of the present invention.
Figure 7B:
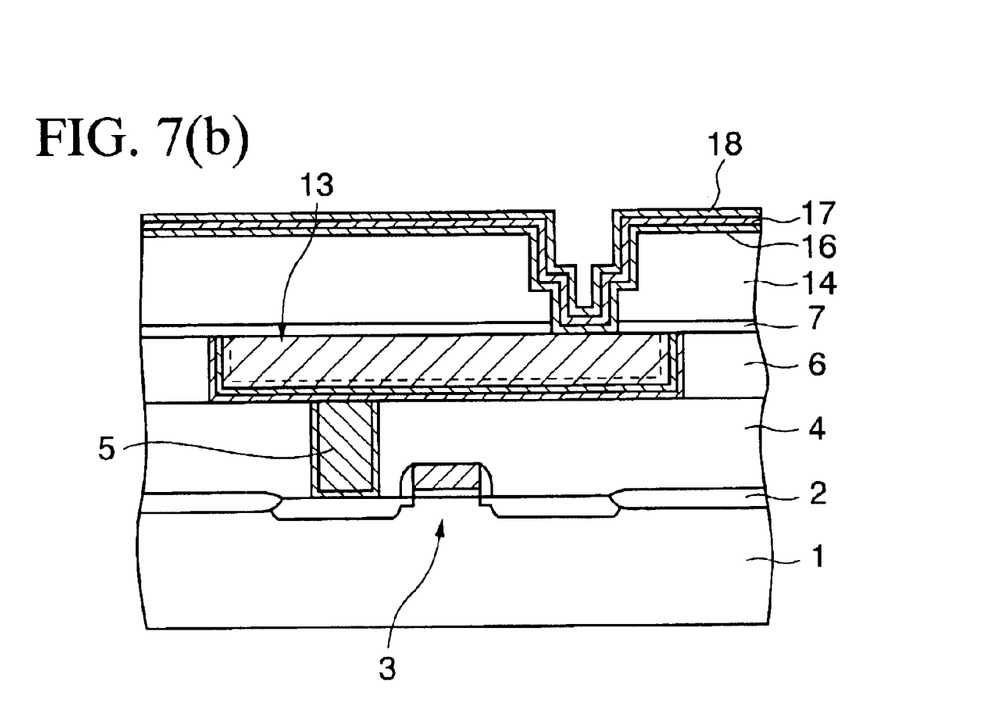
Figure 8A:
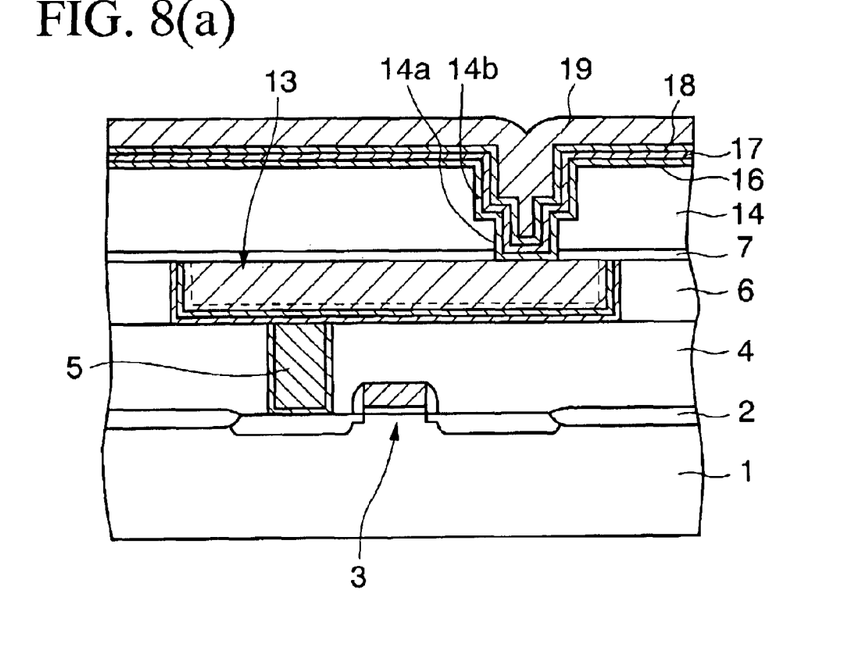
FIGS. 8(a),(b) are sectional views (#3) showing steps of forming the wiring and the via of the semiconductor device according to the second embodiment of the present invention.
Figure 8B:
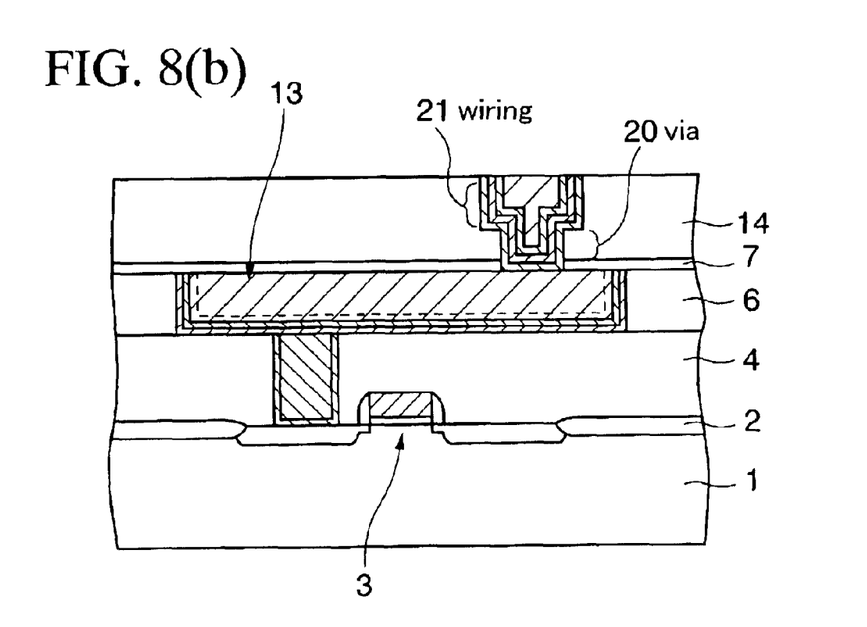

FIG. 6 to FIG. 8 are sectional views showing steps of forming a multi-layered copper wiring structure showing a second embodiment of the present invention. In this case, in FIG. 6 to FIG. 8, the same symbols as those shown in FIG. 1(a) denote the same elements.

First, as shown in FIG. 1, the MOS transistor 3 formed on the silicon substrate 1 is covered with the first and second interlayer insulating films 4, 6, then the first wiring 13 is formed in the second interlayer insulating film 6, and then the silicon nitride film 7 and the third interlayer insulating film 14 are formed on the first wiring 13.

In such state, as shown in FIG. 6(a), a via hole 14a is formed in areas of the third interlayer insulating film 14 and the silicon nitride film 7, which overlap with the first wiring 13, by the photolithography method. Then, a trench 14b that passes over the via hole 14a is formed in an upper portion of the third interlayer insulating film 14 by the photolithography method. The via hole 14a is formed to have a depth that reaches the first wiring 13. The trench 14b is formed shallower than the via hole 14a by controlling the etching conditions of the third interlayer insulating film 14. Also, the trench 14b may be formed prior to the via hole 14a.

Then, the silicon substrate 1 is put into the chamber of the CVD equipment. Then, as shown in FIG. 6(b), a first underlying layer 16 made of TiN or TiN compound is formed on respective inner peripheral surfaces and bottom surfaces of the via hole 14a and the trench 14b and an upper surface of the third interlayer insulating film 14 to have a thickness of 5 to 10 nm. The TiN or TiN compound is grown by the CVD method using TDEAT under the same conditions as the first embodiment. In this case, a tantalum nitride (TaN) layer, a tungsten nitride (WN) layer may be formed as the first underlying layer 16 by the PVD method or the CVD method.

Then, as shown in FIG. 7(a), a second underlying layer 17 made of ZrN or ZrN compound is formed in the same CVD chamber to have a thickness of 1 to 5 nm. The ZrN or ZrN compound is grown by the CVD method using TDEAZ under the same conditions as the first embodiment. At this time, a minute amount of NH₃ as well as the material gas may be supplied to the growth atmosphere (chamber). In this case, the growth conditions such as a flow rate of the gas, etc. pressure, temperature are controlled such that a ratio of the atomic number of the Zr in the second underlying layer 17 is in excess of 30 atoms %. Also, the ZrN constituting the second underlying layer 17 has an average particle diameter of 10 nm or less, and the third underlying layer 17 is formed like a micro crystallite or an amorphous.

Then, as shown in FIG. 7(b), a copper seed layer 18 of 30 to 100 nm thickness is formed on the second underlying layer 17 by the CVD method employing the material gas containing Cu(hfac)tmvs under the same conditions as the first embodiment, for example.

Then, as shown in FIG. 8(a), a second copper layer 19 is formed on the copper seed layer 18 by the electrolytic plating to bury perfectly the via hole 14a and the second trench 14b.

Then, as shown in FIG. 8(b), the second copper layer 19, the copper seed layer 18, and the first and second underlying layers 16, 17, which are formed on an upper surface of the third interlayer insulating film 14, are removed by the CMP method. As a result, the second copper layer 19, the copper seed layer 18, and the first and second underlying layers 16, 17, which are left in the via hole 14a are used as a conductive via 20, and also the second copper layer 19, the copper seed layer 18, and the first and second underlying layers 16, 17, which are left in the second trench 14b, are used as a second wiring 21. In this case, the first and second underlying layers 16, 17 act as lower layers of the via 20 and the wiring 21. Also, the copper seed layer 18 and the second copper layer 19 act as main conductive layers of the via 20 and the wiring 21.

Then, a silicon nitride film, an interlayer insulating film, etc. (not shown) are formed on the second wiring 21. An alloy of zirconium and copper is formed between the second underlying layer and the copper layer 19 by the growth temperature applied when such insulating film is formed by the CVD method.

(Third Embodiment)

As shown in the second embodiment, when a diameter and a depth of the via hole 14a formed in the interlayer insulating film 14 are set to 0.15 to 0.25 µm and 0.8 to 1.2 µm respectively and an aspect ratio thereof is set to about 5, the coverage of the underlying layer in the via hole 14a between the present embodiment and the prior art will be compared as follows.

Figure 9A:
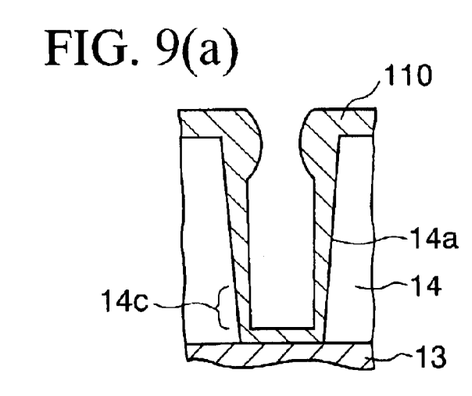
FIGS. 9(a),(b),(c) are sectional views showing difference in shapes of the underlying layers according to differences in the method of forming the underlying layer constituting the via in the prior art.

First, as shown in FIG. 9(a), a TiN layer 110 was grown as the underlying layer in the via hole 14a and its periphery by the sputtering method. At this time, it was confirmed that such TiN layer 110 is overhung at the upper portion of the via hole 14a whereas the coverage at a lower side wall 14c of the via hole 14a is 10% or less and is not good. The percentage of this coverage is a thickness of the film formed on the inner peripheral surface of the via hole 14a with respect to the diameter of the via hole 14a.

Figure 9B:
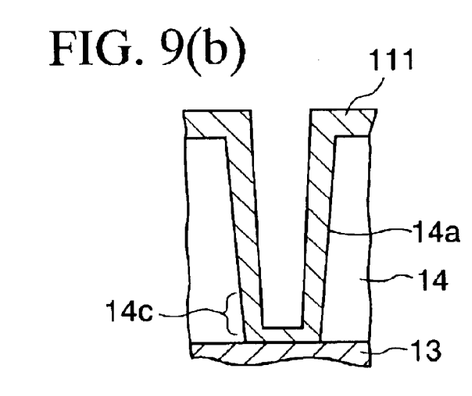

Also, as shown in FIG. 9(b), a TiN layer 111 was grown as the underlying layer in the via hole 14a and its periphery by the CVD method employing TDEAT only. At this time, such TiN layer 111 was not overhung at the upper portion of the via hole 14a whereas the coverage at the lower side wall 14c of the via hole 14a was about 50% or less. However, the specific resistance of the TiN layer 111 becomes high such as 500 µΩcm or more.

Figure 9C:
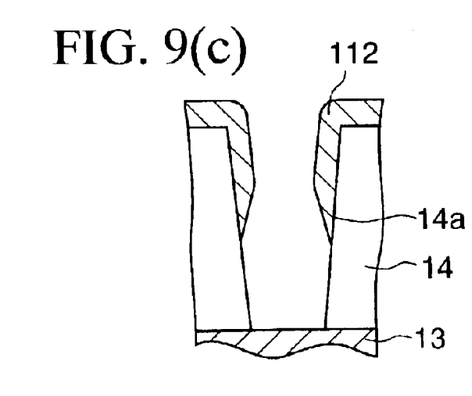

In addition, a TiN layer 112 was grown as the underlying layer in the via hole 14a and its periphery by the CVD method employing TDEAT, into which $NH_3$ is added, as the source gas. At this time, the specific resistance could be reduced up to about 200 µΩcm. However, as shown in FIG. 9(c), the coverage at the side wall of the via hole 14a became worse and thus the merit obtained by employing the CVD method is not exhibited. This is because TDEAT and $NH_3$ react with each other before they enter into the bottom of the via hole 14a.

Figure 10:
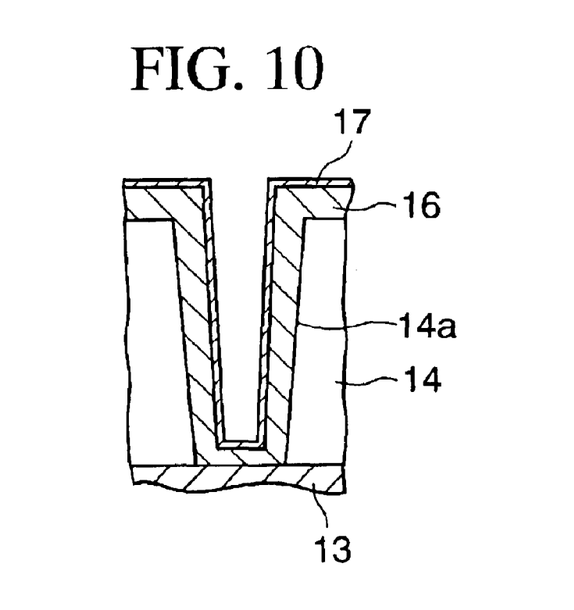
FIG. 10 is a sectional view showing a shape of the underlying layer in the via hole constituting the semiconductor device according to the present invention.

In contrast, according to the present embodiment, the underlying layers 16, 17 having the double-layered structure were formed by growing the TiN layer (the first underlying layer 16) in the via hole 14a and its periphery by the CVD method employing TDEAT and then growing the ZrN layer (the second underlying layer 17) by the CVD method employing TDEAZ. At this time, as shown in FIG. 10, such TiN layer was not overhung at the upper portion of the via hole 14a, and the coverage at the lower side wall of the via hole 14a was about 50%. In addition, the resistance ratio of the overall underlying layers 16, 17 could be reduced to 200 µΩcm and thus the contact resistance between the via 20 and the first wiring 13 could be reduced.

(Other Embodiment)

In the above embodiments, the zirconium nitride layer is formed in the via hole and the trench as the second underlying layer that is formed on the first underlying layer serving as the barrier layer to prevent the diffusion of copper. But that may be formed of other material.

It is preferable that the material of the second underlying layer should have three properties such that such material is melted appropriately together the copper, the film resistance is relatively low, and such material can be grown by the CVD method.

First, if the constituent material of the second underlying layer has the appropriate solid solubility to the copper, the adhesion between the underlying layer and the copper layer can be improved. Second, if the film resistance is low, increase in the wiring resistance or the contact resistance can be suppressed and thus the merit obtained by forming the wiring resistance or the plug contact resistance of the copper can be used practically. Third, if such material can be grown by the CVD method, the coverage in the via hole can be improved.

As the metal material that satisfies above three properties, cadmium (Cd), zinc (Zn), or silver (Ag) may be listed in addition to zirconium. Physical property values of these materials are given in Table 1.

TABLE 1

| | Resistance of Each Material and Solubility Limit to Cu | | |
|---|---|---|---|
| Element | Atomic Weight | Specific Resistance (µ Ωcm) | Solubility Limit to Cu (wt %) |
| Zr | 91.224 | 40.00 | 0.02 |
| Cd | 112.411 | 6.83 | 4.0 |
| Zn | 65.390 | 5.92 | 40.0 |
| Ag | 107.868 | 1.59 | >50.0 |

In Table 1, Zn and Ag have the relatively large solubility limit to Cu. However, if the resistance and Cu are alloyed when any one of these materials is used as the underlying layer, such material never increases largely the resistance of the copper layer. Thus, such material can be employed as the second underlying layer.

Figure 11:
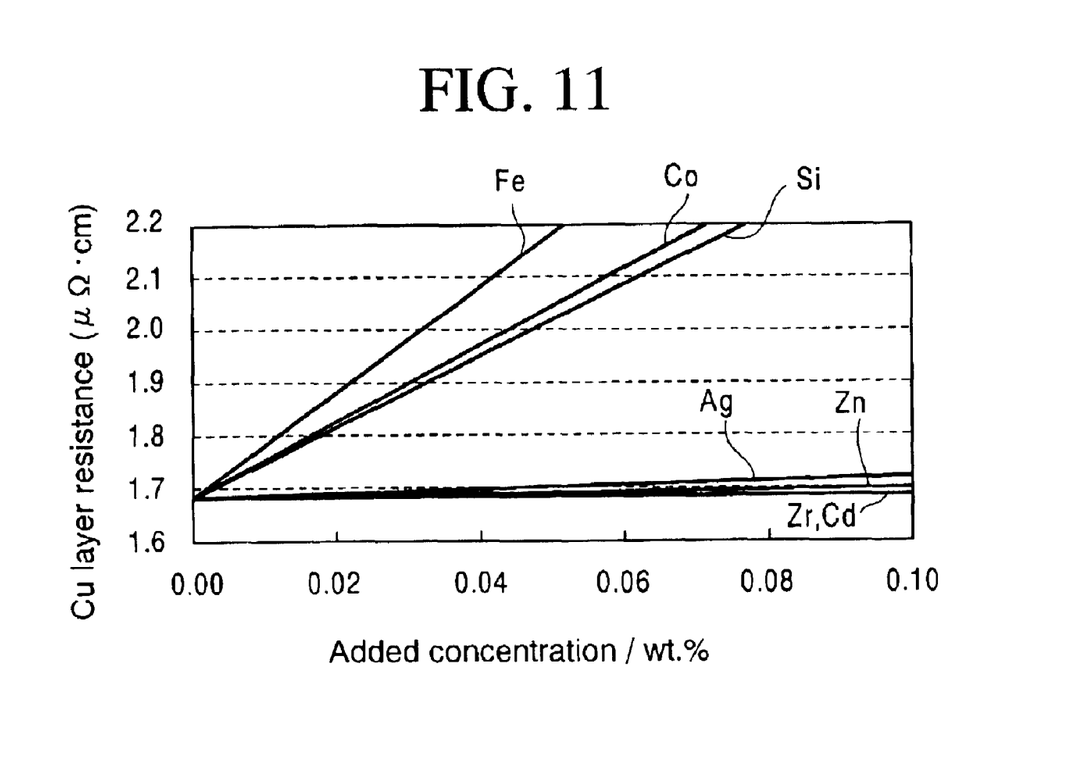
FIG. 11 is a view showing an increase in a resistance of the copper layer due to addition of a different metal into the copper layer employed as the wiring or the plug in the semiconductor device according to the present invention.

Relationships between the specific resistance of the copper layer and an additive concentration when Zn, Zr, Cd, Ag, Si, Co, or Fe is added into the copper layer, which is formed on the underlying layer, as the additive are given as shown in FIG. 11. According to FIG. 11, because the addition of Si, Co or Fe to the copper layer causes an increase in the resistance of the copper layer, such addition is not preferable. In contrast, even if Zn, Zr, Cd or Ag is added to the copper layer, the resistance value of the copper layer is seldom changed. The specific resistance of the copper layer is about 2.20 µΩcm if Ag is added to the copper layer by 10 wt %, while the specific resistance of the copper layer is about 2.10 µΩcm if Zn is added to the copper layer by 10 wt %. Also, the resistance of the copper layer is 1.98 µΩcm if Cd is added to the copper layer by 4 wt % as the solubility limit. In addition, the resistance of the copper layer is scarcely changed like about 1.69 µΩcm if Zr is added to the copper layer by 0.02 wt % as the solubility limit.

As a result, it is desired that the metal constituting the second underlying layer should be solid-solved in the ranged of 0.01 to 10.0 wt % with respect to the copper.

Zn, Cd, or Ag constituting the second underlying layer can be formed by the CVD method employing the source shown in Table 2. In this case, the metal deposited as the second underlying layer may be nitrided by employing ammonium ($NH_3$) or hydrazine ($N_2H_4$) together with the material shown in Table 2 by several to several tens wt %.

TABLE 2

CVD Film Forming Material of Each Metal

| Deposited Metal | | CVD Material |
|---|---|---|
| Cd | Cd(CH$_3$)$_2$ | Dimethylcadmium |
| | CdCl$_2$ | Cadmium(II)chloride |
| | CdBr$_2$ | Cadmium bromide |
| Zn | Zn(CH$_3$)$_2$ | Dimethylzinc |
| | Zn(C$_2$H$_5$)$_2$ | Diethyizince |
| Ag | AgCl | Silver chloride |

Also, in the above embodiments, TDEAZ is employed when ZrN is formed as the second underlying layer by the CVD method. In this case, zirconium chloride (ZrCl$_4$) may be employed in place of TDEAZ. If ZrCl$_4$ is employed, an amount of impurity such as carbon, hydrogen, or the like can be reduced rather than the case that TDEAZ is employed. Also, if the ZrN layer is formed by employing ZrCl$_4$, ammonium or hydrazine is added to ZrCl$_4$ by several or several tens wt %. In this case, if the Zr layer is formed as the second underlying layer, ammonium or hydrazine is not employed as the additive gas.

However, the resistance of the second underlying layer that is formed by using ZrCl$_4$ is increased rather than the second underlying layer that is obtained from the TDEAZ material. Also, if the first underlying layer employed to prevent the diffusion of copper is grown by using the organic material, it is not preferable from a viewpoint of preventing the mixture of the carbon, etc. that the same CVD chamber should be employed.

Also, in each above embodiments, the SiO$_2$ layer containing the impurity such as fluorine, boron, or phosphorus may be employed as the material constituting the interlayer insulating film.

As described above, according to the present invention, the first underlying layer made of copper diffusion preventing conductive material such as titanium nitride, tantalum nitride, or tungsten nitride or material that contains them as major components, or the like; the second underlying layer formed on the first underlying layer and made of the material containing zirconium, cadmium, zinc or silver, or alloy of zirconium, cadmium, zinc or silver, or zirconium and nitrogen; and the main conductive layer formed on the second underlying layer and made of copper or copper alloy are buried in the insulating film as the wiring or the plug (via). Therefore, the specific resistances of the first and second underlying layers are lowered rather than the case that the lower layer of the wiring or the plug is constructed only by the first underlying layer. In addition, the adhesion between these underlying layers and the copper layer or the copper alloy layer can be increased rather than the prior art. Thus, the good wiring or via can be constructed by the underlying layers and the copper layer or the underlying layers and the copper alloy layer.

What is claimed is:

1. A semiconductor device comprising:

an insulating film formed over a semiconductor substrate;

a trench and a hole formed in the insulating film;

a first underlying layer formed in at least one of the trench and the hole and made of conductive material to prevent diffusion of copper;

a main conductive layer formed in at least one of the trench and the hole on the first underlying layer and made of copper or copper alloy; and a second underlying layer formed between the main conductive layer and the first underlying layer and having a metal element that is solid-solved in the main conductive layer at an interface between the second underlying layer and the main conductive layer, and formed on the first underlying layer by a CVD method, wherein a thickness of the second underlying layer is less than 5 nm, and the second underlying layer is solid-solved between 0.01 wt % and 10.1 wt % with respect to the main conductive layer, wherein the second underlying layer is configured to adhere the first underlying layer to the main conductive layer.

2. A semiconductor device according to claim 1, wherein the second underlying layer is made of zirconium, cadmium, zinc or silver, or alloy of zirconium, cadmium, zinc or silver, or material containing zirconium and nitrogen.

3. A semiconductor device according to claim 2, wherein the material containing zirconium and nitrogen is amorphous or microcrystalline zirconium nitride.

4. A semiconductor device according to claim 3, wherein an average particle diameter of the material containing zirconium and nitrogen is 10 nm or less.

5. A semiconductor device according to claim 3, wherein the material containing zirconium and nitrogen contains the zirconium in excess of 30 atoms % of a ratio of number of atoms.

6. A semiconductor device according to claim 1, wherein the second underlying layer has a thickness of 5 nm or less.

7. A semiconductor device according to claim 1, wherein the second underlying layer has a film thickness that is smaller than half of the first underlying layer.

8. A semiconductor device according to claim 1, wherein the first underlying layer is made of any one of titanium nitride, tantalum nitride, and tungsten nitride.

9. A semiconductor device according to claim 1, wherein the first underlying layer has a thickness of 10 nm or less.

* * * * *